(12) United States Patent
Chuah et al.

(10) Patent No.: US 11,589,460 B2
(45) Date of Patent: Feb. 21, 2023

(54) SYSTEM IN PACKAGE DUAL CONNECTOR

(71) Applicant: Intel Corporation, Santa Clara, CA (US)

(72) Inventors: Tin Poay Chuah, Pulau Pinang (MY); Min Suet Lim, Pulau Pinang (MY); Chee Chun Yee, Pinang (MY); Yew San Lim, Pulau Pinang (MY); Eng Huat Goh, Pulau Pinang (MY)

(73) Assignee: INTEL CORPORATION, Santa Clara, CA (US)

( * ) Notice: Subject to any disclaimer, the term of this patent is extended or adjusted under 35 U.S.C. 154(b) by 258 days.

(21) Appl. No.: 17/090,911

(22) Filed: Nov. 6, 2020

(65) Prior Publication Data

US 2022/0078911 A1 Mar. 10, 2022

(30) Foreign Application Priority Data

Sep. 4, 2020 (MY) .............................. PI2020004586

(51) Int. Cl.
*H05K 1/11* (2006.01)
*H05K 1/14* (2006.01)
(52) U.S. Cl.
CPC .............. *H05K 1/118* (2013.01); *H05K 1/144* (2013.01); *H05K 2201/10189* (2013.01)

(58) Field of Classification Search
CPC ................... H05K 1/118; H05K 1/144; H05K 2201/10189
USPC .......................................................... 361/803
See application file for complete search history.

(56) References Cited

U.S. PATENT DOCUMENTS

2006/0140211 A1* 6/2006 Huang ...................... G06F 1/26
370/360
2015/0357821 A1* 12/2015 Grana ..................... H02J 3/381
307/143

* cited by examiner

*Primary Examiner* — Andargie M Aychillhum
(74) *Attorney, Agent, or Firm* — Viering, Jentschura & Partner mbB

(57) ABSTRACT

A multilayer printed circuit board including a first printed circuit board portion, including a first inserting connector, including a plurality of contacts for creating a first removable bus connection; a second printed circuit board portion, including a second inserting connector, including a plurality of contacts for creating a second removable bus connection; a third printed circuit board portion, connected between the first printed circuit board portion and to the second printed circuit board portion, wherein a rigidity of the third printed circuit board portion is less than a rigidity of each of the first printed circuit board portion and the second printed circuit board portion; wherein the multilayer printed circuit board is foldable along the third printed circuit board portion and, if so folded, the first printed circuit board portion is arranged on top of the second printed circuit board portion.

19 Claims, 11 Drawing Sheets

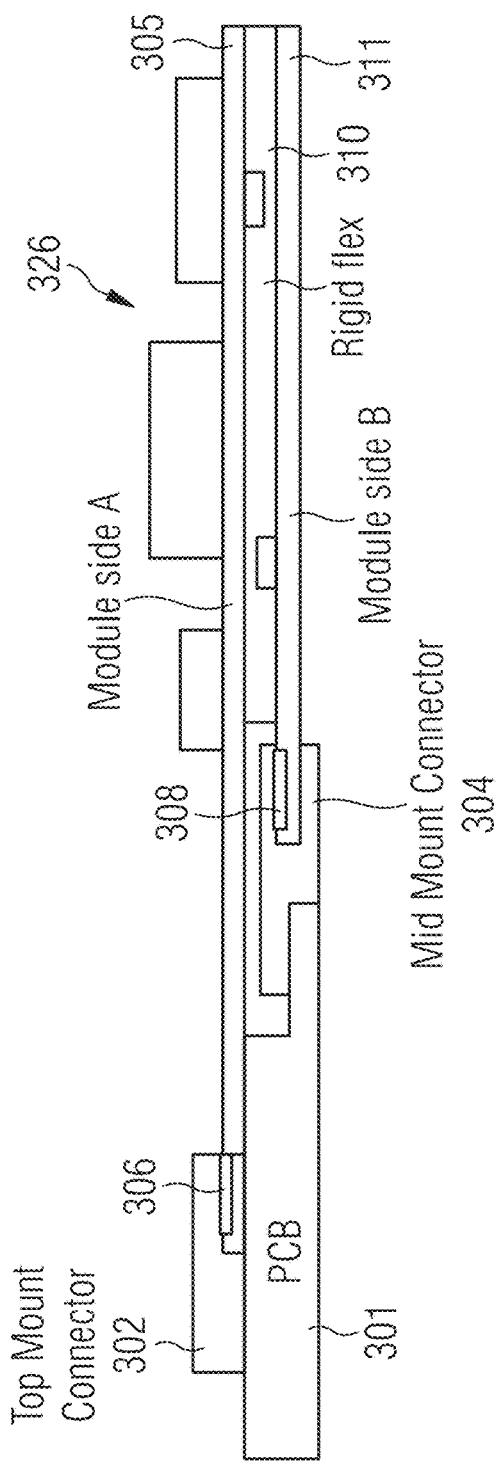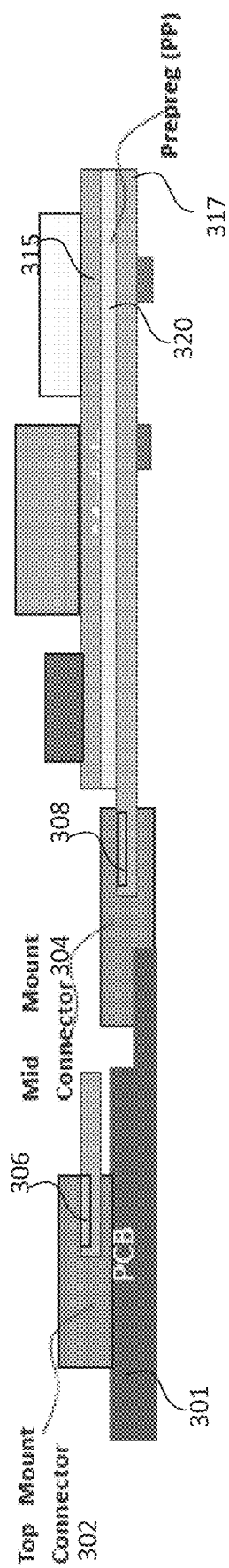
FIG. 3
FIG. 4

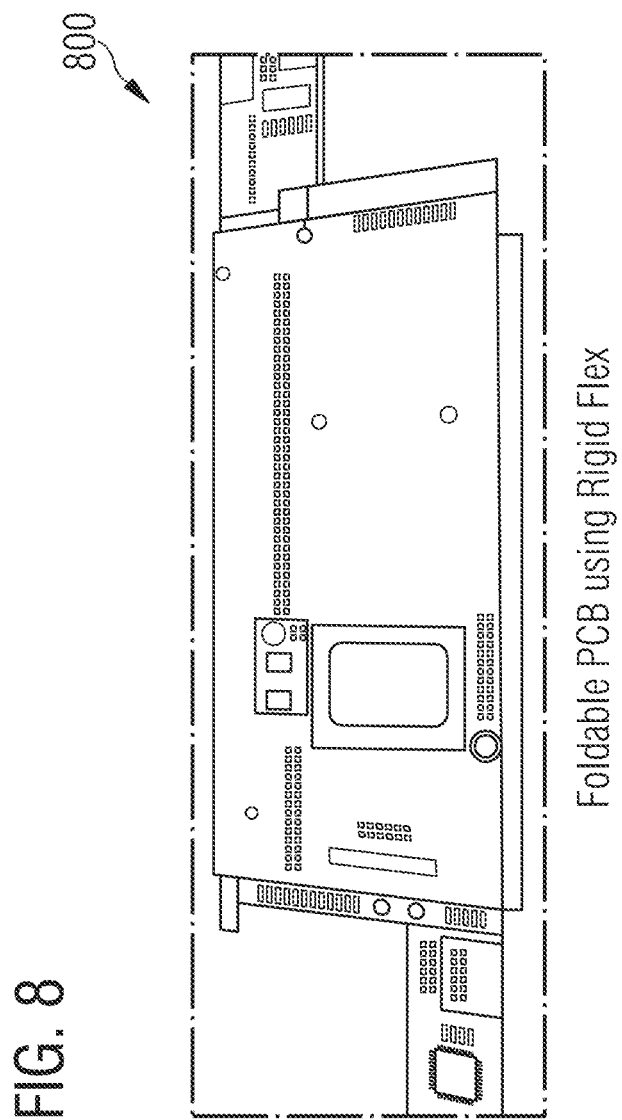

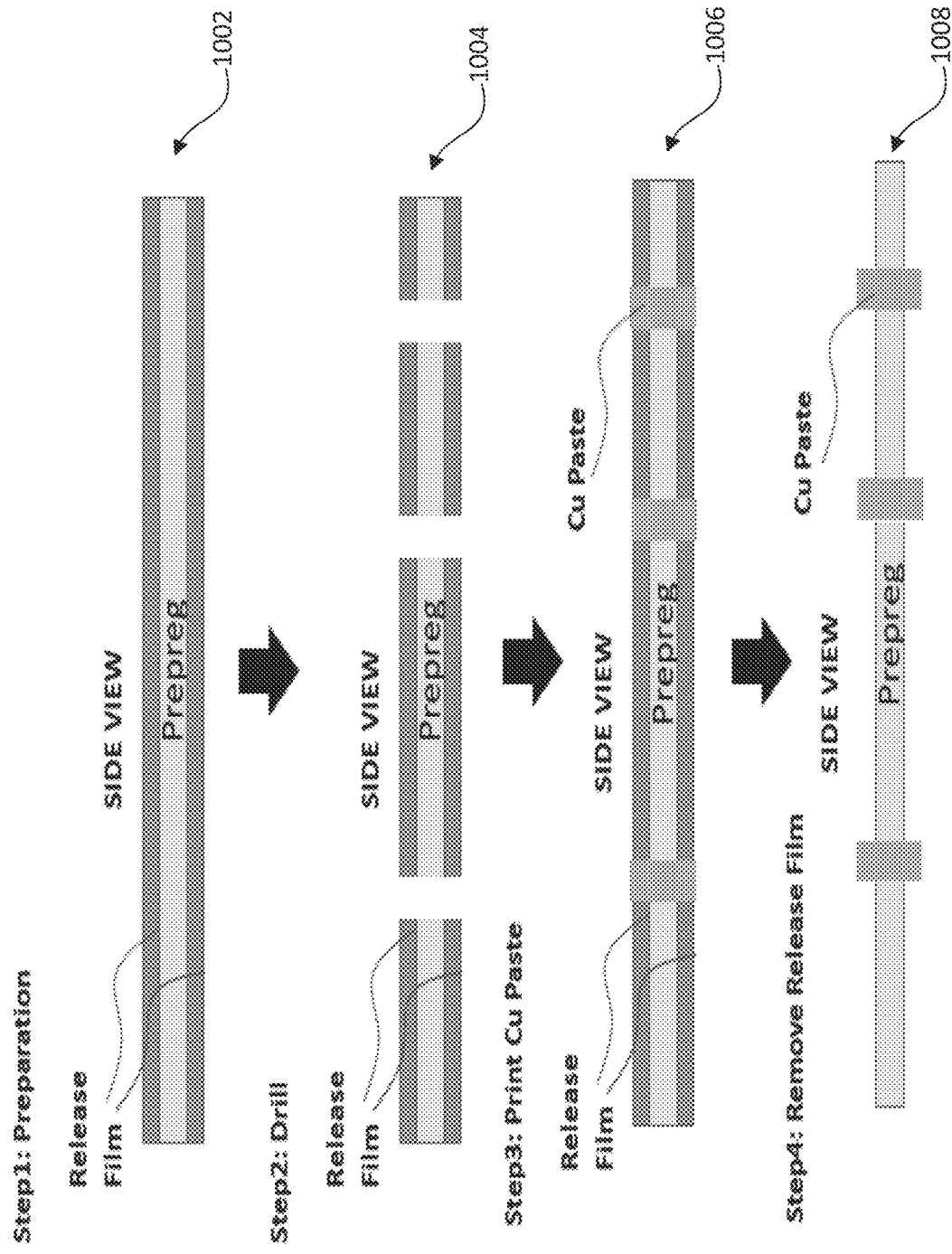

FIG. 10B
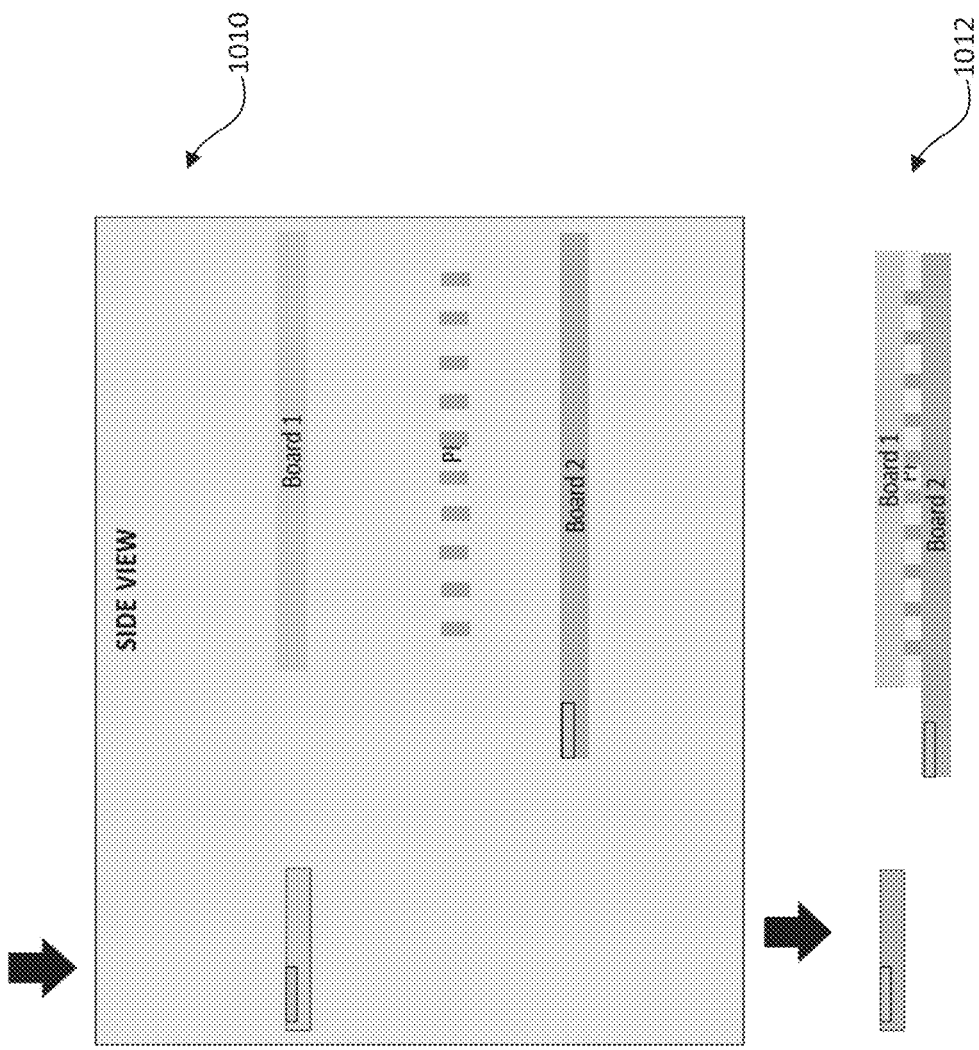
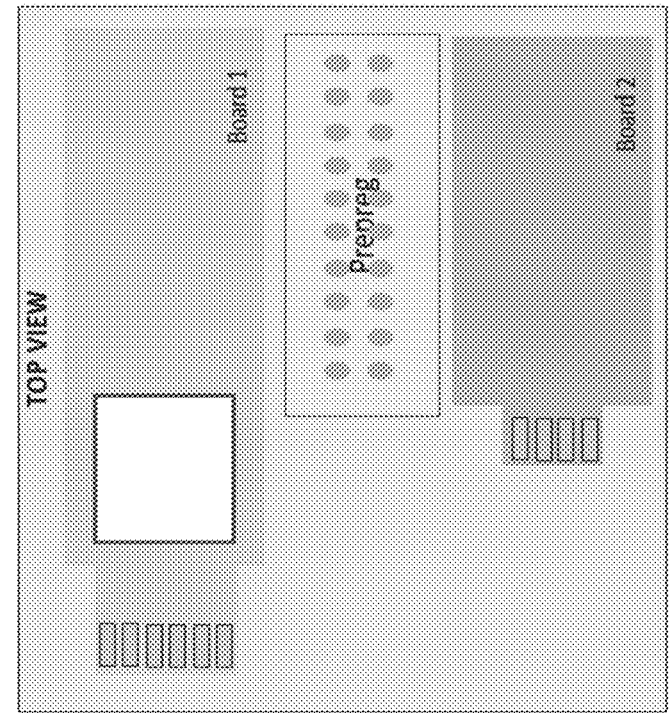
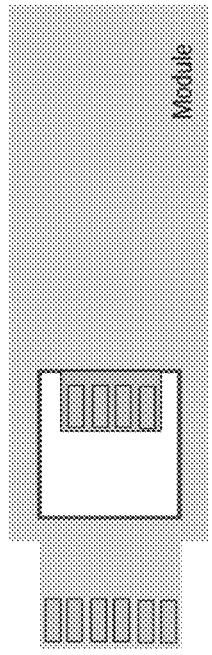

SYSTEM IN PACKAGE DUAL CONNECTOR

CROSS-REFERENCE TO RELATED APPLICATIONS

This non-provisional application claims priority to Malaysian Patent Application No. PI2020004586, which was filed on Sep. 4, 2020, which is incorporated by reference herein in its entirety.

TECHNICAL FIELD

Various aspects of the disclosure generally relate to connectors for systems in packages.

BACKGROUND

A system-in-package (SiP) may include a plurality of integrated circuits in one or more chip carrier packages, which may be stacked upon one another. Because the multiple integrated circuits permit SiPs to perform a plurality of functions, they are widely used in a variety of electronic systems.

SiP dies may be stacked vertically and/or tiled horizontally. SiPs are typically connected to neighboring chips (also referred to herein as "daughter boards"), and these connections are conventionally achieved via either ball grid array (BGA) or standard wire-based board-to-board connections.

BGA connections may be favored in some implementations, as they permit a large quality of connections within a small area. That is, BGA connections are able to provide higher IO/mm$^2$ connection with smaller ball pitch. This high density of connections may permit reduced size and/or high transmission speeds, which may be desirable. Nevertheless, BGA connections are rigid and difficult to alter. SiPs connected by BGAs may be difficult to remove or exchange, and they may be considered by the consumer as being permanent or unchangeable. In many devices, it may be desirable to exchange the SiP, such as by updating or upgrading the SiP within the device. This may be difficult or impossible to achieve when the SiP is connected via BGA connections.

Alternatively, it is known to connect SiPs via wire-based board-to-board connections. These standard wire-based board-to-board connections may include a plurality of wires or electrodes, each leading to a single connector. Typically, the connecter includes a row of pins or holes, which are fitted together with a row of complementary pins or holes. Consumers may prefer these connections, as they are easily removed and thus permit parts to be relatively easily exchanged or updated. For example an SiP connected to a neighboring chip (e.g. daughter board) via such a wire-based board-to-board connector could easily be separated from the neighboring chip by disconnecting the row of pins from the row of holes, or vice versa.

Due to their design, however, these wire-based board-to-board connectors tend to provide only a single row of connections, which may result in much reduced connection density than would be possible with a BGA connection. This reduced connection density typically results in large connection area, greater size, and/or reduced transmission speeds. As a result, these wire-based board-to-board connections may be disfavored or unsuitable for various implementations or applications.

BRIEF DESCRIPTION OF THE DRAWINGS

In the drawings, like reference characters generally refer to the same parts throughout the different views. The drawings are not necessarily to scale, emphasis instead generally being placed upon illustrating the exemplary principles of the disclosure. In the following description, various exemplary embodiments of the disclosure are described with reference to the following drawings, in which:

FIG. 3 depicts a multilayer printed circuit board according to a first aspect of the disclosure;

FIG. 4 depicts a multilayer printed circuit board according to a second aspect of the disclosure;

FIG. 8 depicts a multilayer printed circuit board according to another aspect of the disclosure;

FIGS. 10A and 10B depict a first portion of manufacture/preparation of the middle layer of the multilayer printed circuit board according to the second aspect of the disclosure.

DESCRIPTION

Figure 1A:
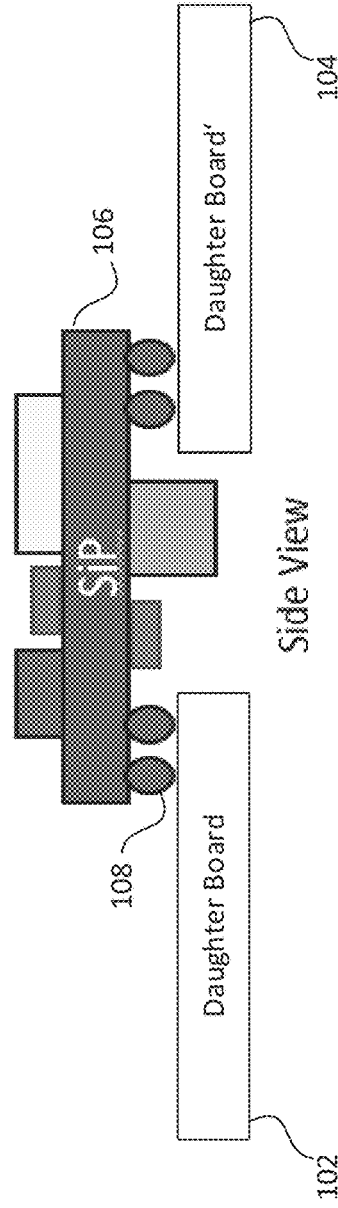
FIGS. 1A and 1B depict known board-to-board interconnections.

The following detailed description refers to the accompanying drawings that show, by way of illustration, exemplary details and embodiments in which aspects of the present disclosure may be practiced.

The word "exemplary" is used herein to mean "serving as an example, instance, or illustration". Any embodiment or design described herein as "exemplary" is not necessarily to be construed as preferred or advantageous over other embodiments or designs.

Throughout the drawings, it should be noted that like reference numbers are used to depict the same or similar elements, features, and structures, unless otherwise noted.

The phrase "at least one" and "one or more" may be understood to include a numerical quantity greater than or equal to one (e.g., one, two, three, four, [ . . . ], etc.). The phrase "at least one of" with regard to a group of elements may be used herein to mean at least one element from the group consisting of the elements. For example, the phrase "at least one of" with regard to a group of elements may be used herein to mean a selection of: one of the listed elements, a plurality of one of the listed elements, a plurality of individual listed elements, or a plurality of a multiple of individual listed elements.

The words "plural" and "multiple" in the description and in the claims expressly refer to a quantity greater than one. Accordingly, any phrases explicitly invoking the aforementioned words (e.g., "plural [elements]", "multiple [elements]") referring to a quantity of elements expressly refers to more than one of the said elements. For instance, the phrase "a plurality" may be understood to include a numerical quantity greater than or equal to two (e.g., two, three, four, five, [ . . . ], etc.).

The phrases "group (of)", "set (of)", "collection (of)", "series (of)", "sequence (of)", "grouping (of)", etc., in the description and in the claims, if any, refer to a quantity equal to or greater than one, i.e., one or more. The terms "proper subset", "reduced subset", and "lesser subset" refer to a subset of a set that is not equal to the set, illustratively, referring to a subset of a set that contains less elements than the set.

The term "data" as used herein may be understood to include information in any suitable analog or digital form, e.g., provided as a file, a portion of a file, a set of files, a signal or stream, a portion of a signal or stream, a set of signals or streams, and the like. Further, the term "data" may also be used to mean a reference to information, e.g., in form of a pointer. The term "data", however, is not limited to the aforementioned examples and may take various forms and represent any information as understood in the art.

SiP modules are often designed to be side-slotted into board-to-board connectors of one or more daughter boards. This side-slot connection may be achieved using one or more removable wire-based pin connections. Herein are described examples of, and techniques for, creating multiple removable wire-based pin connections on a single multilayer printed circuit board, thereby resulting in increased input/output density/mm2 for board to board connections. Furthermore, the resulting connections are removable and thereby permit upgrading/reworking by plugging in and unplugging the SiP. This configuration may increase the number of pin connections on an SiP and thereby improve a resulting data rate.

FIG. 1A depicts a known board-to-board interconnection using a reflow BGA. In this figure, two daughter boards 102 and 104 are connected to an SiP 106 via a plurality of BGAs 108. As described above, the plurality of BGAs 108 may provide a large number of connections between the SiP 106 and the daughter boards 102 and 104 at a high connection density. The significant number of connections may permit relatively high transmission speeds between the SiP 106 and the daughter boards 102 and 104. Nevertheless, the BGAs 108 require significant effort to remove, such as application of significant heat, as well as re-soldering to a replacement component. Because of the difficulty in exchanging components that are connected with BGAs 108, they may be undesirable for certain applications, and it is desired to find an alternative that provides easier exchange of components.

Figure 1B:
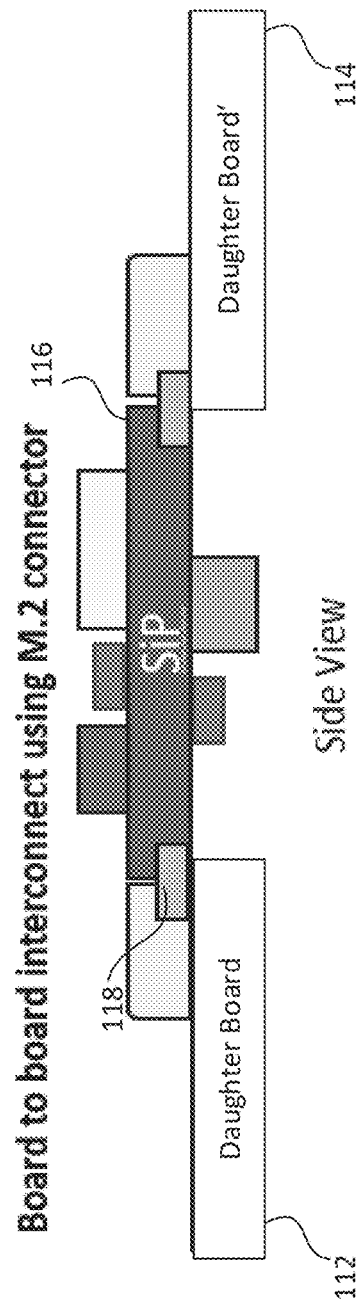

FIG. 1B depicts a known board-to-board interconnection of two daughter boards 112 and 114 to an SiP 116 using a plurality of removable wire-based pin connections 118 (only one connection is labeled; however, the SiP may include a separate connection to each daughter board 112 and 114). As stated above, such removable wire-based pin connections may be desirable because they are easily removable and therefore allow for comparatively simple exchange of components. Such pin connections, however, are generally limited to a single row of pins, which typically results in far fewer connections than may otherwise be possible in a BGA connection. The reduced number of connections may be associated with reduced data transmission speeds. Therefore, such pin-based connections may be undesirable for certain implementations, and it is desired to find an alternative that provides faster data speed while maintaining ease of exchange between components.

Figure 2A:
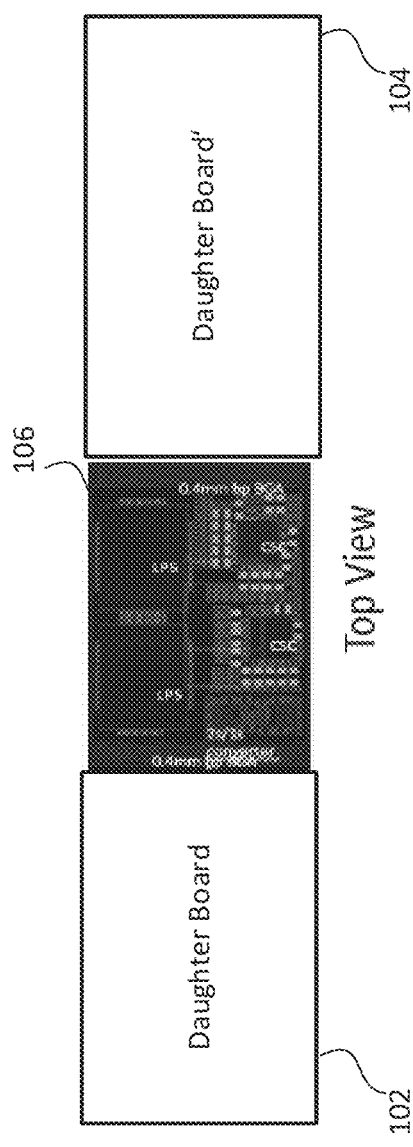
FIGS. 2A and 2B depict an alternate view of the elements of FIGS. 1A and 1B, respectively.

FIG. 2A depicts a top view of the components depicted in FIG. 1A. In this figure, an SiP 106 is connected to two daughter boards 102 and 104 via a plurality of BGA connections (not pictured).

Figure 2B:
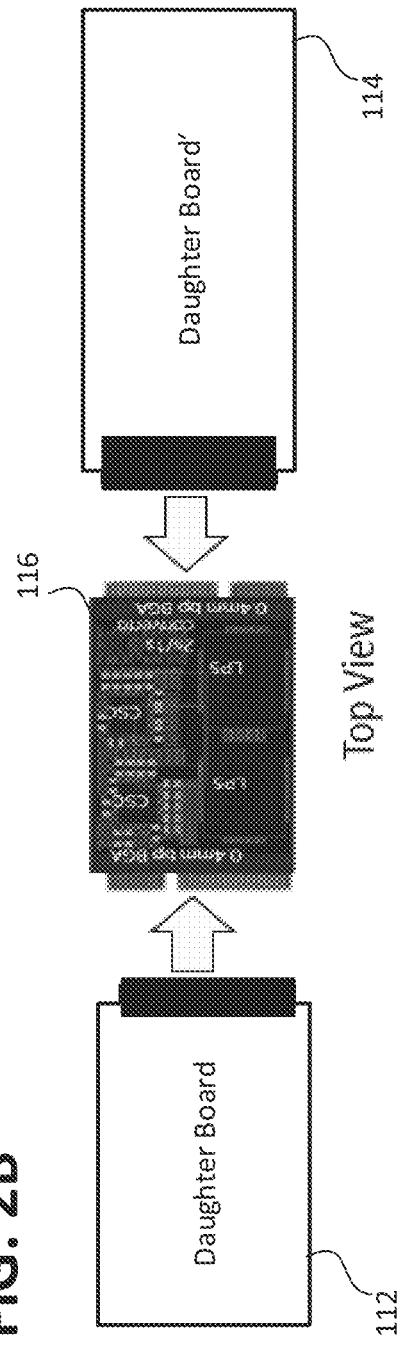

FIG. 2B depicts a top view of the components depicted in FIG. 1B. In this figure, an SiP 116 is connected to two daughter boards 112 and 114 via a plurality of removable wire-based pin connections.

FIG. 3 depicts a multilayer printed circuit board according to a first aspect of the disclosure. In this figure, a daughter board (depicted as a printed circuit board (PCB)) 301 is connected to an SiP 326 (depicted as a plurality of components). The SiP 326 is mounted on a multilayer printed circuit board that includes a first printed circuit board portion 305, a second printed circuit board portion 311, and third printed circuit board portion (also referred to herein as a flexible layer and/or a rigid flex layer) 310. The first printed circuit board portion 305 is connected to the daughter board 301 via a top mount connector 302 and a first removable wire-based pin connection 306. The second printed circuit board portion 311 is connected to the daughter board 301 via a mid-mount connector 304 and a second removable wire-based pin connection 308. The first printed circuit board portion 305 and the second printed circuit board portion 311 are connected to one another via the rigid flex layer 310. The first printed circuit board portion 305 and the second printed circuit board portion 311 may have a greater rigidity than the rigid flex layer 310. That is, the rigid flex layer 310 may be flexible, bendable and/or foldable, whereas the first printed circuit board portion 305 and the second printed circuit board portion 311 may be less flexible, less bendable and/or less foldable than the rigid flex layer 310. According to one aspect of the disclosure, the multilayer printed circuit board may be created with the rigid flex layer 310 between the first printed circuit board portion 305 and the second printed circuit board portion 311, and the rigid flex layer 310 may be folded such that the first printed circuit board portion 305 and the second printed circuit board portion 311 become stacked upon one another.

The rigid flex layer 310 may include one or more electrically conductive connections, electrically connecting the first printed circuit board portion 305 to the second printed circuit board portion 311. In this way, the first printed circuit board portion 305 may communicate with the second printed circuit board portion 311. Otherwise stated, an output of any component located on the first printed circuit board portion 305 may be sent to an input of any component on the second printed circuit board portion 311, and/or vice versa. According to an aspect of the disclosure, the multilayer printed circuit board may include a rigid flex layer covered on one or both sides (e.g. top and bottom surfaces) by a rigid layer. In the manufacturing process, portions of one or both rigid layers may be removed from the rigid flex layer, leaving behind a flexible area, coupled to the first printed circuit board portion and the second printed circuit board portion. In this manner, the multilayer printed circuit board may be considered a single element from which one or more rigid portions have been removed to leave only a flexible portion.

FIG. 4 depicts a multilayer printed circuit board according to a second aspect of the disclosure. In this figure, a daughter board 301 is connected to an SiP 326 including a first printed circuit board portion 315 and a second printed circuit board portion 317 connected by a flexible layer 320 including a electrically conductive sintered paste connection. The first printed circuit board portion 315 is connected to the daughter board via a top mount connector 302 using a removable wire-based pin connector 306. The second printed circuit board portion 317 is connected to the daughter board 301 via a mid-mount connector 304 using a removable wire-based pin connector 308. FIG. 4 differs from FIG. 3 in at least two attributes. First, the rigid flex material 310 is replaced by a flexible layer 320 that includes one or more electrically conductive paste connections. According to an aspect of the disclosure, and as will be discussed in greater detail, the flexible layer may include Prepreg, which is treated with an electrically conductive paste. Prepreg is generally understood to mean (pre-impregnated) and includes a plurality of composite fibers with a thermoset polymer matrix material or a thermoplastic resin, which is used to bind the fibers together. Second, the bottom portion of top mount connector 302 of FIG. 4 is depicted as being placed lower than the top portion of mid-mount connector 304. Because of this geometry. The first printed circuit board portion 315 may not be connected within the top mount connector 302 while passing over the mid-mount connector 304 if the first printed circuit board portion 315 remains a solid, unbroken layer. One solution to this problem is to include a cutout (not pictured in this figure) within the first printed circuit board portion 315, which may permit the mid-mount connector 304 to rise through the cut out and thereby through the plane on which the first printed circuit board portion 315 rests. Otherwise stated, the first printed circuit board portion 315 may include a cutout, which allows the first printed circuit board portion 315 to be placed around an exterior of the mid-mount connector 304. This configuration will be described in greater detail infra.

Figure 5:
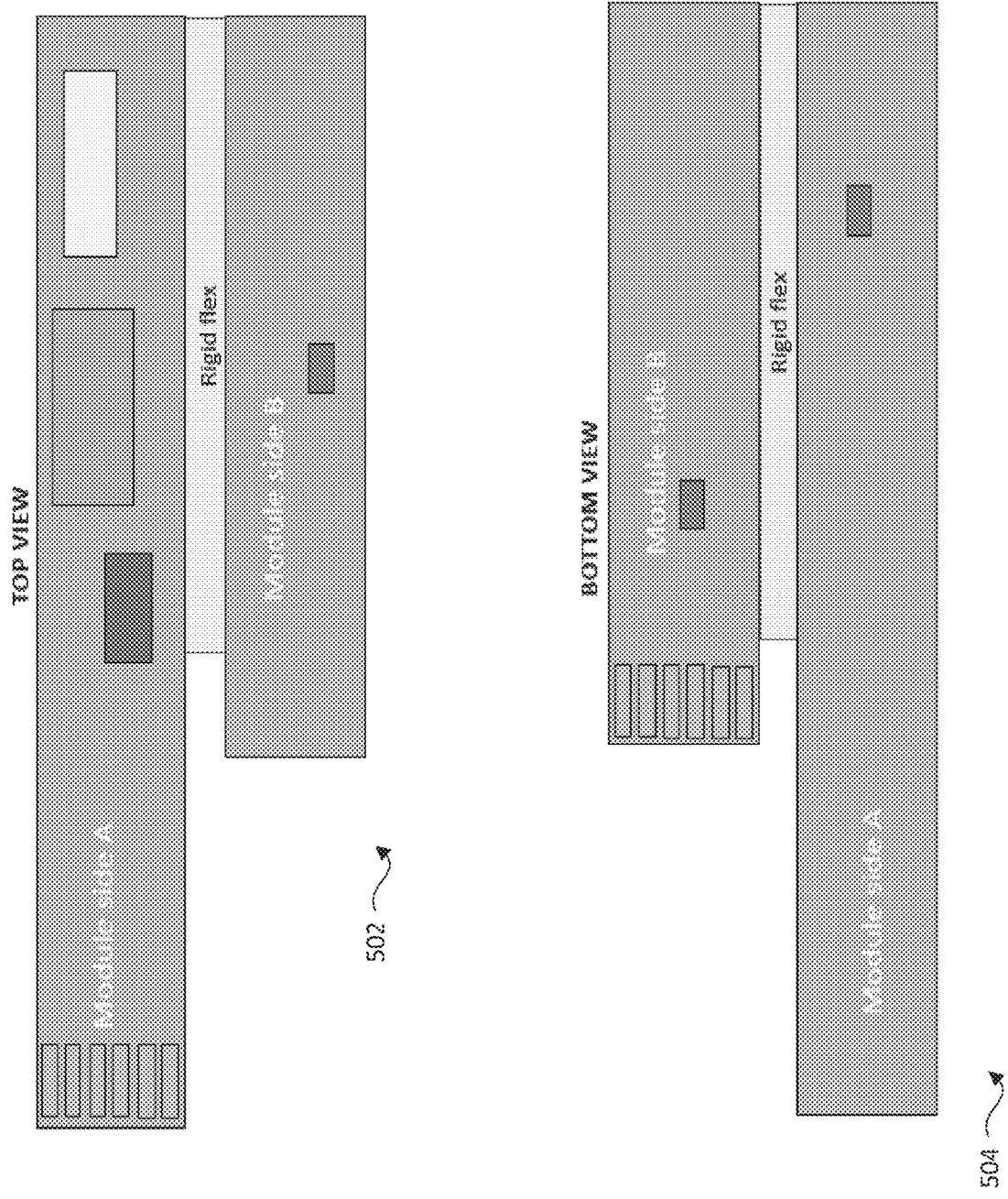
FIG. 5 depicts a top view and a bottom view of the multilayer printed circuit board depicted in FIG. 3.

FIG. 5 depicts a top view 502 and a bottom view 504 of the multilayer printed circuit board depicted in FIG. 3, according to an aspect of the disclosure. In this configuration, the removable wire-based pin connector of the first printed circuit board portion (depicted as the top layer in the top view 502) may be located on a first side (in this case, a top side) of the multilayer printed circuit board. The removable wire-based pin connector of the second printed circuit board portion (depicted as the top layer in the bottom view 504) may be located on a second side (in this case, a bottom side) of the multilayer printed circuit board. Otherwise stated, the pin connectors may be located on opposite sides of the multilayer printed circuit board, such that the pin connections are both exposed when the multilayer printed circuit board is folded. According to another aspect of the disclosure, the pin connector on the longer of the rigid layers may be on either side, whereas the pin connector on the shorter of the rigid layers may be configured only on the side that is exposed when the multilayer printed circuit board is folded.

Figure 6:
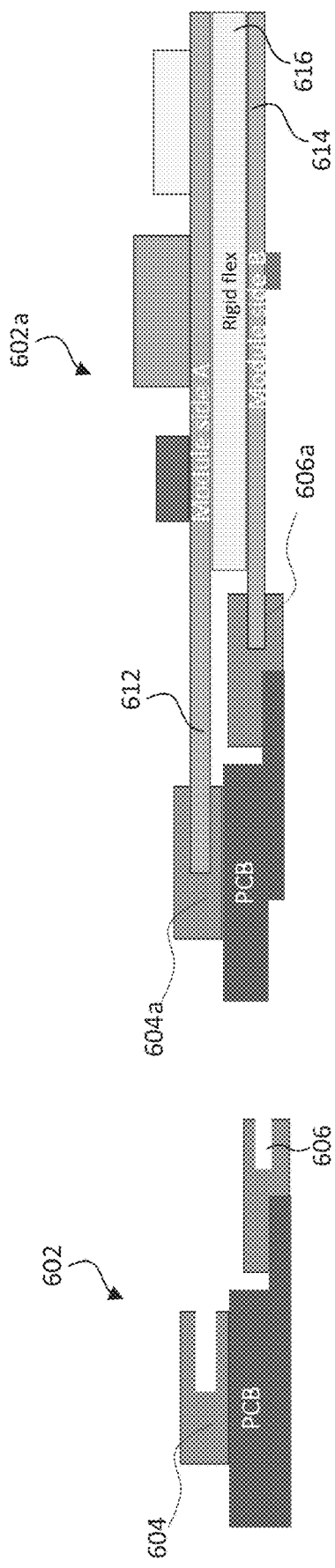
FIG. 6 depicts the multilayer printed circuit board according to an aspect of the disclosure.

FIG. 6 depicts the multilayer printed circuit board according to an aspect of the disclosure. In this case, the daughter board and its two receiving connectors are depicted in 602, wherein the top mount connector is depicted as 604, and the mid-mount connector is depicted as 606. In 602a, the daughter board and connectors of 602 are depicted as being connected to a multilayer printed circuit board as described herein. In this configuration, the first printed circuit board portion 612 is connected to the second printed circuit board portion 614 via a rigid flex layer 616. The removable wire-based pin connector (not pictured) of the first printed circuit board portion 612 is connected to and received by the top mount connector 604a, and the removable wire-based pin connector (not pictured) of the second printed circuit board portion 614 is connected to, and received by, the mid-mount connector 606a.

Figure 7:
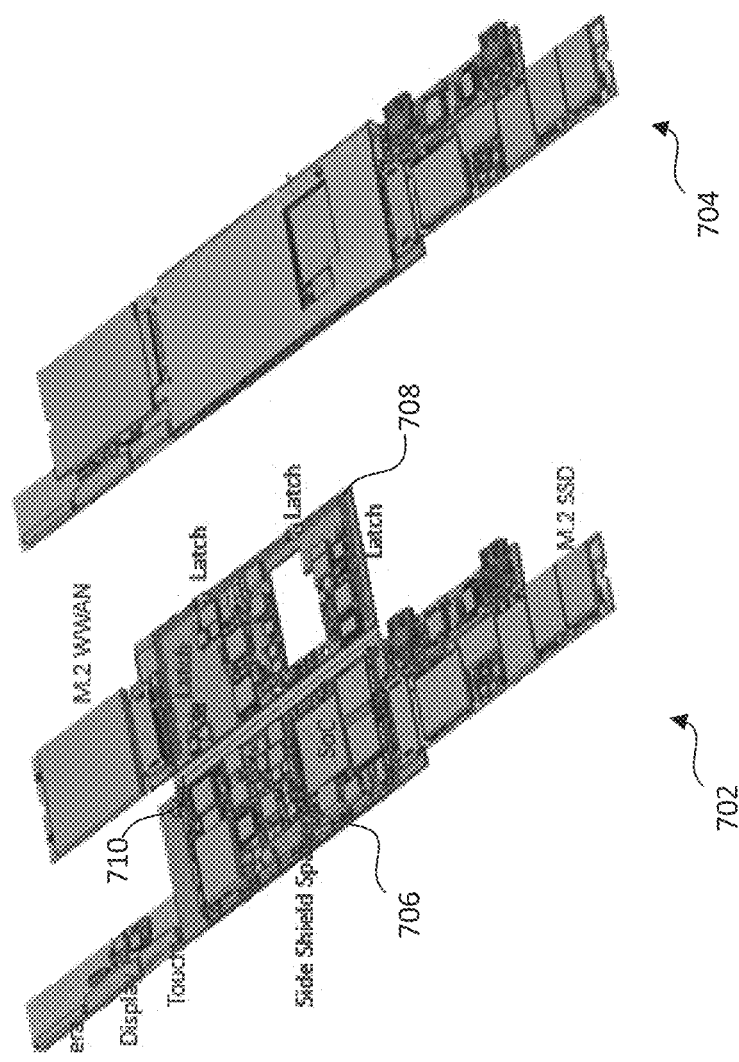
FIG. 7 depicts a multilayer printed circuit board according to an aspect of the disclosure.

FIG. 7 depicts a multilayer printed circuit board according to an aspect of the disclosure. The multilayer printed circuit board is depicted as being unfolded in 702 and being folded in 704. In the unfolded configuration 702, the first printed circuit board portion 706 is coupled to the second printed circuit board portion 708 via the flexible layer 710. In the folded configuration 704, the second printed circuit board portion 708 is folded on top of the first printed circuit board portion 706 via the flexible layer 710.

FIG. 8 depicts a multilayer printed circuit board 800 according to another aspect of the disclosure. In this image, the second printed circuit board portion (not labeled) is depicted as being folded on top of the first printed circuit board portion (not labeled) via a rigid flex layer connecting the first printed circuit board portion and the second printed circuit board portion.

Figure 9A:
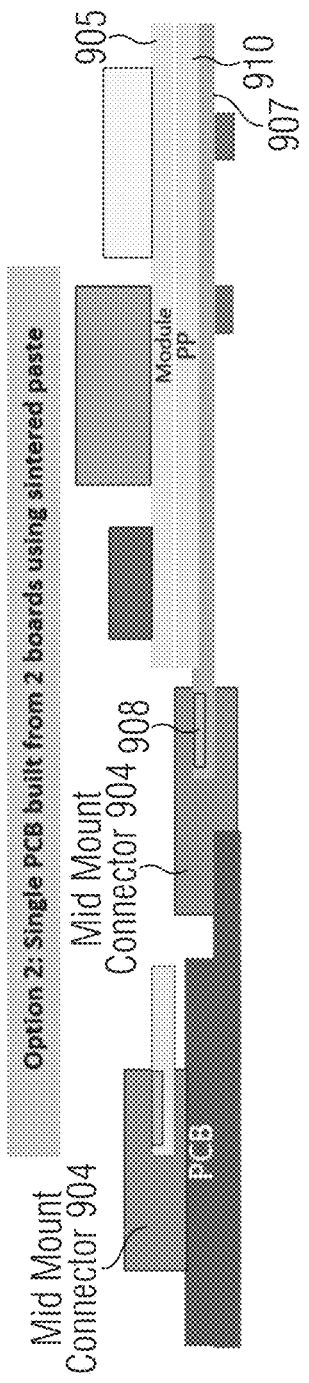
FIGS. 9A and 9B depict a multilayer printed circuit board according to various aspects of the disclosure.

FIG. 9A depicts a multilayer printed circuit board according to a second aspect of the disclosure. In this figure, a first printed circuit board portion 905 and a second printed circuit board portion 907 are connected to one another via an electrically conductive sintered paste layer 910. Paste sintering is a technique by which surfaces are connected via an electrically conductive, often metal containing, paste. As in the previous examples, the first printed circuit board portion 905 includes one or more removable wire-based pin connectors 906, which are received by the top mount connector 902 of the daughter board. The second printed circuit board portion 907 includes one or more removable wire-based pin connectors 908, which are received by the mid-mount connector 904 of the daughter board. Unlike the previous examples, in which the first printed circuit board portion and the second printed circuit board portion were connected via a flexible material, the first printed circuit board portion 905 and the second printed circuit board portion 907 are stacked together and rigidly connected via the sintering paste 910.

Figure 9B:
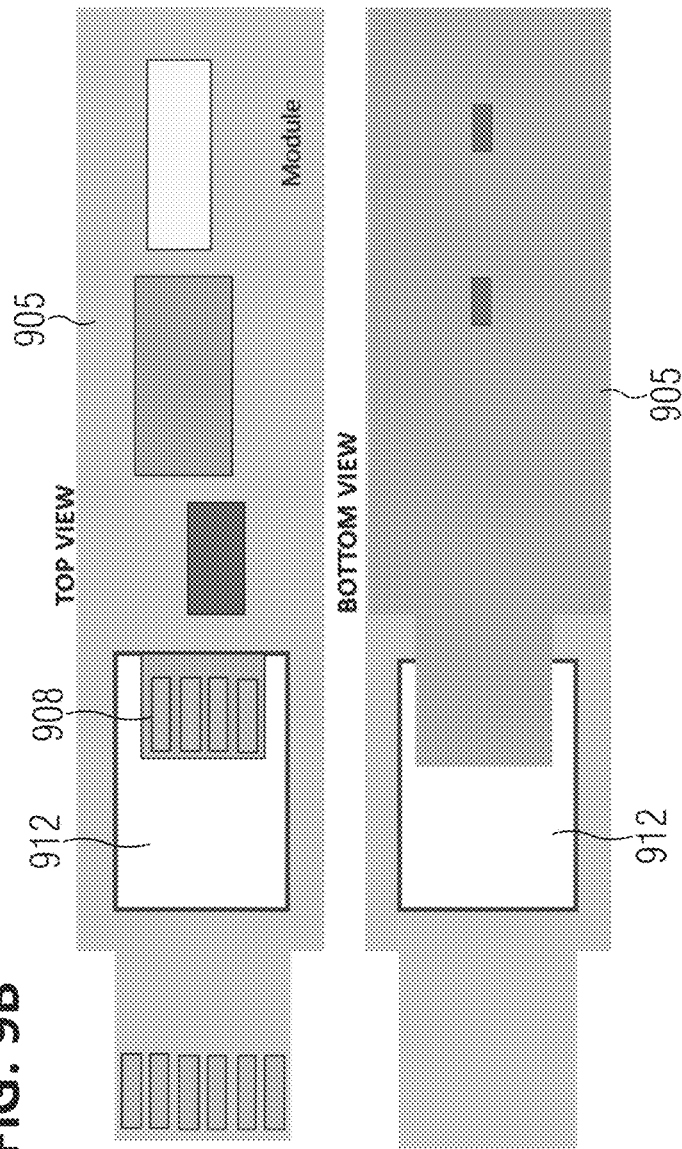

FIG. 9B depicts the multilayer printed circuit board according to another aspect of the disclosure. In this figure, the first printed circuit board portion 905 is depicted in a top view and a bottom view. The first printed circuit board portion 905 includes a cutout 912, which may be understood as a portion of the first printed circuit board portion 905 that is cut out or removed, such as to accommodate one or more portions of a mid-mount connector. Although the cutout is shown here with respect to an aspect of the disclosure including a sintering paste, this cutout may also be applied to other aspects of the disclosure describing connection of the first printed circuit board portion and the second printed circuit board portion via a flexible material. The cutout 912 may be desired in circumstances in which a top portion of the mid-mount connector 904 is placed higher than a bottom portion of a receiving opening of the top mount connector (the opening into which the removable wire-based pin connector of the first printed circuit board portion is inserted). In this configuration, and were the cutout not present, the height of the mid-mount connector may otherwise prevent the first printed circuit board portion from being inserted into the top mount connector. The cutout, by accommodating one or more portions of the mid-mount connector, may reduce a minimum height of the first printed circuit board portion, thereby allowing the first printed circuit board portion to be inserted into the top mount connector. According to an aspect of the disclosure, the cutout 912 may be located such that a portion of the removable wire-based pin connector of the second printed circuit board portion 908 may be visible through the cutout if the first printed circuit board portion and the second printed circuit board portion are folded together via the flexible layer.

FIG. 10A depicts a first portion of manufacture/preparation of the middle layer (including sintering paste) of the multilayer printed circuit board according to the second aspect of the disclosure. In 1002, a layer of Prepreg is depicted as being covered on a top portion and a bottom portion by a release film. In 1004, the layer of Prepreg is drilled to create one or more openings. In 1006, the one or more openings created by drilling in 1004 are filled with an electrically conductive paste (e.g. a copper paste). In 1008, the release film is removed, thereby leaving the layer of Prepreg with the electrically conductive paste connections. FIG. 10B depicts a manufacturer of the multilayer printed circuit board using the Prepreg layer as manufactured in FIG. 10A, according to an aspect of the disclosure. In 1010, the first printed circuit board portion and the second printed circuit board portion are arranged with the Prepreg layer (containing the electrically conductive paste) between them. In 1012, a sintering process occurs to bind the first printed circuit board portion to the second printed circuit board portion via Prepreg layer with the electrically conductive paste.

According to an aspect of the disclosure, the one or more removable wire-based pin connections as described herein may be M.2 connections. M.2 is a connection type that is formally known as the Next Generation Form Factor and is a standard for removable wire-based pin connections, such as, but not limited to, for use in input output devices, buses, or otherwise.

Figure 11:
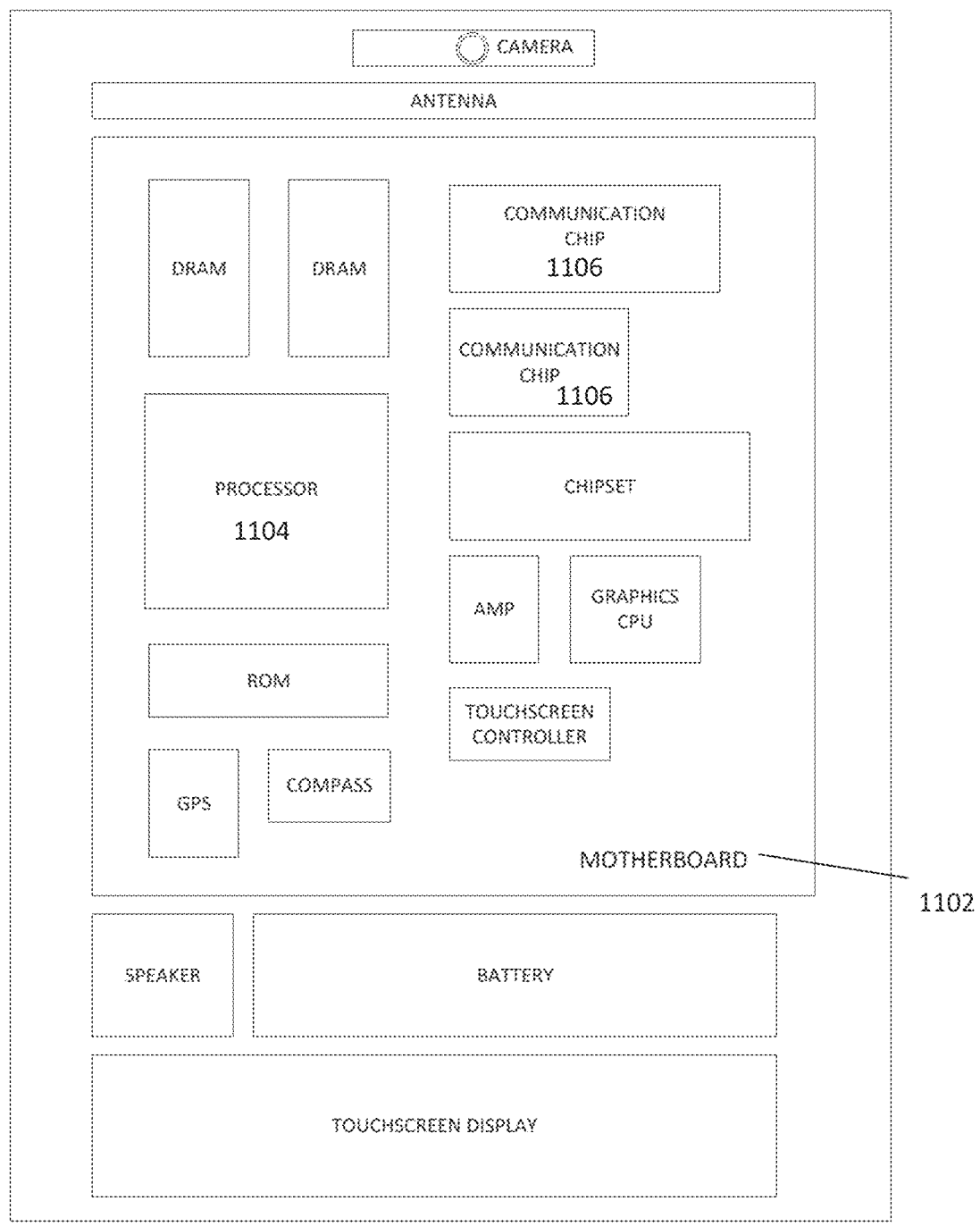
FIG. 11 depicts a computing device.

Aspects of the present disclosure may be implemented into a system using any suitable hardware and/or software. FIG. 11 schematically illustrates a computing device 1100 that may include a semiconductor package as described herein, in accordance with some aspects. The computing device 1100 may house a board such as a motherboard 1102. The motherboard 1102 may include a number of components, including but not limited to a processor 1104 and at least one communication chip 1106. The processor 1104, which may have a device according to the present disclosure, may be physically and electrically coupled to the motherboard 1102. In some implementations, the at least one communication chip 1106 may also be physically and electrically coupled to the motherboard 1102. In further implementations, the communication chip 1106 may be part of the processor or package 1104.

Depending on its applications, computing device 1100 may include other components that may or may not be physically and electrically coupled to the motherboard 1102. These other components may include, but are not limited to, volatile memory (e.g. DRAM), non-volatile memory (e.g. ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, a camera, and a mass storage device (such as hard disk drive, compact disk (CD), digital versatile disk (DVD), and so forth). In another aspect, the processor 1104 of the computing device 1100 may be packaged in device as described herein.

The communication chip 1106 may enable wireless communications for the transfer of data to and from the computing device 1100. The term "wireless" and its derivatives may be used to describe circuits, devices, systems, methods, techniques, communications channels, etc. that may communicate data through the use of modulated electromagnetic radiation through a non-solid medium. The term does not imply that the associated devices do not contain any wires, although in some aspects they might not. The communication chip 1106 may implement any of a number of wireless standards or protocols, including but not limited to Institute for Electrical and Electronic Engineers (IEEE) standards including Wi-Fi (IEEE 1102.11 family), IEEE 1102.16 standards (e.g., IEEE 1102.16-2005 Amendment), Long-Term Evolution (LTE) project along with any amendments, updates, and/or revisions (e.g., advanced LTE project, ultra-mobile broadband (UMB) project (also referred to as "3GPP2"), etc.). IEEE 1102.16 compatible BWA networks are generally referred to as WiMAX networks, an acronym that stands for Worldwide Interoperability for Microwave Access, which is a certification mark for products that pass conformity and interoperability tests for the IEEE 1102.16 standards.

The communication chip 1106 may also operate in accordance with a Global System for Mobile Communication (GSM), General Packet Radio Service (GPRS), Universal Mobile Telecommunications System (UMTS), High-Speed Packet Access (HSPA), Evolved HSPA (E-HSPA), or LTE network. The communication chip 1106 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1106 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 1106 may operate in accordance with other wireless protocols in other aspects.

The computing device 1100 may include a plurality of communication chips 1106. For instance, a first communication chip 1106 may be dedicated to shorter range wireless communications such as Wi-Fi and Bluetooth and a second communication chip 1106 may be dedicated to longer range wireless communications such as GPS, EDGE, GPRS, CDMA, WiMAX, LTE, Ev-DO, and others.

In various implementations, the computing device 1100 may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In an aspect, the computing device 1100 may be a mobile computing device. In further implementations, the computing device 1100 may be any other electronic device that processes data.

The removable wire-based pin connections described herein according to any aspect of the disclosure may be implemented in the computing device 1100 and/or in any component of the computing device shown in FIG. 11.

The removable wire-based pin connections may include a plurality of wire connections, parallelly-oriented next to each other in a row. The plurality of wire connections may be mounted on a rigid layer of a circuit board, such that they may be easily inserted into or removed from a connector, such as a mount connection. The geometry of such connections typically necessitates that the plurality of pin connections be arranged in a single row, which limits the number of pin connections based on a width of the available connection area. According to an aspect of the disclosure, this row-arrangement of connections may be described herein as a one-dimensional connection.

In contrast, BGA connections may be configured with a plurality of ball-connections along a first row followed by a plurality of ball connections along one or more multiple rows. The arrangement of multiple rows of connections may be described herein as a two dimensional arrangement, wherein the connections are arranged not only along the width of the circuit board, but also along a length. This may result in a greater density of connections compared to that of a removable wire-based pin connection.

By implementing the principles and methods described herein, the number of wire connections available in a printed circuit board (e.g. limited by a width of a printed circuit board) may be doubled. This may result from the geometry described herein which permits to pin connections to be mounted to the same circuit board. According to an aspect of the disclosure, a given circuit board using the principles and methods described herein may have three or more pin connections. That is, the principles and methods described herein may be expanded to accommodate not only to pin connectors, but also three or more.

According to an aspect of the disclosure, the multilayer printed circuit board, may include a first printed circuit board portion, including a first inserting connector, including a plurality of contacts for creating a first removable bus connection; a second printed circuit board portion, including a second inserting connector, including a plurality of contacts for creating a second removable bus connection; a third printed circuit board portion, connected between the first printed circuit board portion and to the second printed circuit board portion, wherein a rigidity of the third printed circuit board portion is less than a rigidity of each of the first printed circuit board portion and the second printed circuit board portion; wherein the multilayer printed circuit board is foldable along the third printed circuit board portion and, if so folded, the first printed circuit board portion is arranged on top of the second printed circuit board portion.

The first printed circuit board portion may be galvanically connected to the second printed circuit board portion via the third printed circuit board portion. This galvanic connection may be configured such that the first printed circuit board portion is galvanically connected to a first side of the third printed circuit board portion, and the second printed circuit board portion is galvanically connected to a second side of the third printed circuit board portion, wherein the first side of the third printed circuit board portion is opposite the second side of the third printed circuit board portion.

It is, however, not required that the first printed circuit board portion and the second printed circuit board portion be located on opposite sides of the third printed circuit board portion. Rather, the product described herein may alternatively be achieved by locating the first printed circuit board portion and the second printed circuit board portion on adjacent sides of the third printed circuit board portion, such as in an L-formation, according to another aspect of the disclosure.

According to an aspect of the disclosure, the multilayered printed circuit board described herein may be configured as a system along with the plurality of mount connectors of one or more daughter boards. In this way, a bus connection system is disclosed in which the bus system includes a multilayer printed circuit board, including a first printed circuit board portion, including a first inserting connector, including a plurality of contacts for creating a first removable bus connection; a second printed circuit board portion, including a second inserting connector, including a plurality of contacts for creating a second removable bus connection; a third printed circuit board portion, connected between the first printed circuit board portion and to the second printed circuit board portion, wherein a rigidity of the third printed circuit board portion is less than a rigidity of each of the first printed circuit board portion and the second printed circuit board portion; and a component, including a first receiving connector, configured to receive the first inserting connector to create the first removable bus connection; and a second receiving connector, configured to receive the second inserting connector to create the second removable bus connection; wherein the multilayer printed circuit board is foldable along the third printed circuit board portion and, if so folded, the first printed circuit board portion is arranged on top of the second printed circuit board portion.

According to a second aspect of the disclosure, the printed circuit board package may include a first printed circuit board, having a first length, including an upper surface; a lower surface; and a first inserting connector, including a plurality of contacts for creating a first removable bus connection; a second printed circuit board, having a second length, less than the first length, and including an upper surface, fixedly mounted to the lower surface of the first printed circuit board; a lower surface; and a second inserting connector, including a plurality of contacts for creating a second removable bus connection.

According to an aspect of the disclosure, any of the multilayer printed circuit boards described herein may include a cutout within the first printed circuit board. The cutout may be placed such that the second inserting connector is visible through the cutout when the multilayer printed circuit board is folded (assuming a foldable circuit board according to the first aspect of the disclosure) or the second inserting connector may be generally visible through the cutout (assuming a configuration in which the first printed circuit board and the second printed circuit board are rigidly affixed to one another, such as in the electroconductive sintering paste implementations described herein).

Although connectors have been referred to herein as being wire-based, this is not intended to limit the thickness or rigidity of said connectors. That is, the connectors may include a plurality of electrically conductive contacts, which may be configured as wires, electrodes, or in any form desirable for the implementation.

While the above descriptions and connected figures may depict electronic device components as separate elements, skilled persons will appreciate the various possibilities to combine or integrate discrete elements into a single element. Such may include combining two or more circuits for form a single circuit, mounting two or more circuits onto a common chip or chassis to form an integrated element, executing discrete software components on a common processor core, etc. Conversely, skilled persons will recognize the possibility to separate a single element into two or more discrete elements, such as splitting a single circuit into two or more separate circuits, separating a chip or chassis into discrete elements originally provided thereon, separating a software component into two or more sections and executing each on a separate processor core, etc.

Additional aspects of the disclosure are made hereby by way of example:

In Example 1, a multilayer printed circuit board is disclosed, including a first printed circuit board portion, including a first inserting connector, including a plurality of contacts for creating a first removable bus connection; a second printed circuit board portion, including a second inserting connector, including a plurality of contacts for creating a second removable bus connection; a third printed circuit board portion, connected between the first printed circuit board portion and to the second printed circuit board portion, wherein a rigidity of the third printed circuit board portion is less than a rigidity of each of the first printed circuit board portion and the second printed circuit board portion; wherein the multilayer printed circuit board is foldable along the third printed circuit board portion and, if so folded, the first printed circuit board portion is arranged on top of the second printed circuit board portion.

In Example 2, the multilayer printed circuit board of Example 1 is disclosed, wherein the first printed circuit board portion is galvanically connected to the second printed circuit board portion via the third printed circuit board portion.

In Example 3, the multilayer printed circuit board of any one of Examples 1 to 2 is disclosed, wherein the first printed circuit board portion is galvanically connected to a first side of the third printed circuit board portion, and the second printed circuit board portion is galvanically connected to a second side of the third printed circuit board portion.

In Example 4, the multilayer printed circuit board of Example 3 is disclosed, wherein the first side of the third printed circuit board portion is opposite the second side of the third printed circuit board portion.

In Example 5, a bus connection system is disclosed, including a multilayer printed circuit board, including a first printed circuit board portion, including a first inserting connector, including a plurality of contacts for creating a first removable bus connection; a second printed circuit board portion, including a second inserting connector, including a plurality of contacts for creating a second removable bus connection; a third printed circuit board portion, connected between the first printed circuit board portion and to the second printed circuit board portion, wherein a rigidity of the third printed circuit board portion is less than a rigidity of each of the first printed circuit board portion and the second printed circuit board portion; and a component, including a first receiving connector, configured to receive the first inserting connector to create the first removable bus connection; and a second receiving connector, configured to receive the second inserting connector to create the second removable bus connection; wherein the multilayer printed circuit board is foldable along the third printed circuit board portion and, if so folded, the first printed circuit board portion is arranged on top of the second printed circuit board portion.

In Example 6, the bus connection system of Example 5 is disclosed, wherein the first printed circuit board portion is galvanically connected to the second printed circuit board portion via the third printed circuit board portion.

In Example 7, the bus connection system of any one of Examples 5 to 6 is disclosed, wherein the first printed circuit board portion is galvanically connected to a first side of the third printed circuit board portion, and the second printed circuit board portion is galvanically connected to a second side of the third printed circuit board portion.

In Example 8, the bus connection system of Example 7 is disclosed, wherein the first side of the third printed circuit board portion is opposite the second side of the third printed circuit board portion.

In Example 9, a printed circuit board package is disclosed, including a first printed circuit board, having a first length, including an upper surface; a lower surface; and a first inserting connector, including a plurality of contacts for creating a first removable bus connection; a second printed circuit board, having a second length, less than the first length, and including an upper surface, fixedly mounted to the lower surface of the first printed circuit board; a lower surface; and a second inserting connector, including a plurality of contacts for creating a second removable bus connection.

In Example 10, the printed circuit board package of Example 9 is disclosed, wherein the first printed circuit board further includes a cutout.

In Example 11, the printed circuit board package of Example 9 or 10 is disclosed, wherein the first printed circuit board includes a first side and a second side, opposite the first side, and wherein the first inserting connector is located along the second side; wherein the second printed circuit board includes a first side and a second side, opposite the first side, and wherein the second inserting connector is located along the second side; and wherein a distance between the first side of the first printed circuit board and the cutout is approximately equal to a distance between the first side of the second printed circuit board and the second inserting connector.

In Example 12, the printed circuit board package of Example 10 or 11 is disclosed, wherein the second inserting connector is visible through the cutout.

In Example 13, the circuit board package of any one of Examples 9 to 12 is disclosed, further including an electro-conductive layer between the first printed circuit board and the second printed circuit board.

In Example 14, the circuit board package of Example 13 is disclosed, wherein the electro-conductive layer is configured to rigidly fix the first printed circuit board to the second printed circuit board.

In Example 15, the circuit board package of Example 13 or 14 is disclosed, wherein the electro-conductive layer includes a sintering paste.

In Example 16, a bus connection system is disclosed, including a printed circuit board package, including a first printed circuit board, having a first length, including an upper surface; a lower surface; and a first inserting connector, including a plurality of contacts for creating a first removable bus connection; a second printed circuit board, having a second length less than the first length, including an upper surface, fixedly mounted to the lower surface of the first printed circuit board; a lower surface; and a second inserting connector, including a plurality of contacts for creating a second removable bus connection; and a component, including a first receiving connector, configured to receive the first inserting connector to create the first removable bus connection; and a second receiving connector, configured to receive the second inserting connector to create the second removable bus connection.

In Example 17, the bus connection system of Example 16 is disclosed, wherein the first printed circuit board further includes a cutout.

In Example 18, the bus connection system of Example 16 or 17 is disclosed, wherein the first printed circuit board includes a first side and a second side, opposite the first side, and wherein the first inserting connector is located along the second side; wherein the second printed circuit board includes a first side and a second side, opposite the first side, and wherein the second inserting connector is located along the second side; and wherein a distance between the first side of the first printed circuit board and the cutout is approximately equal to a distance between the first side of the second printed circuit board and the second inserting connector.

In Example 19, the bus connection system of Example 17 or 18 is disclosed, wherein the second inserting connector is visible through the cutout.

In Example 20, the bus connection system of any one of Examples 16 to 19 is disclosed, further including an electro-conductive layer between the first printed circuit board and the second printed circuit board.

In Example 21, the bus connection system of Example 20 is disclosed, wherein the electro-conductive layer is configured to rigidly fix the first printed circuit board to the second printed circuit board.

In Example 22, the bus connection system of Example 20 or 21 is disclosed, wherein the electro-conductive layer includes a sintering paste.

In Example 23, a method of manufacturing a multilayer printed circuit board is disclosed, including providing a first printed circuit board portion, including a first inserting connector, including a plurality of contacts for creating a first removable bus connection; providing a second printed circuit board portion, including a second inserting connector, including a plurality of contacts for creating a second removable bus connection; providing a third printed circuit board portion, connected between the first printed circuit board portion and to the second printed circuit board portion, wherein a rigidity of the third printed circuit board portion is less than a rigidity of each of the first printed circuit board portion and the second printed circuit board portion; wherein the multilayer printed circuit board is foldable along the third printed circuit board portion and, if so folded, the first printed circuit board portion is arranged on top of the second printed circuit board portion.

In Example 24, the method of Example 23 is disclosed, wherein the first printed circuit board portion is galvanically connected to the second printed circuit board portion via the third printed circuit board portion.

In Example 25, the method of any one of Examples 23 to 24 is disclosed, wherein the first printed circuit board portion is galvanically connected to a first side of the third printed circuit board portion, and the second printed circuit board portion is galvanically connected to a second side of the third printed circuit board portion.

In Example 26, the method of Example 25 is disclosed, wherein the first side of the third printed circuit board portion is opposite the second side of the third printed circuit board portion.

In Example 27, a method of manufacturing a bus connection system is disclosed, including providing a multilayer printed circuit board, including: a first printed circuit board portion, including a first inserting connector, including a plurality of contacts for creating a first removable bus connection; a second printed circuit board portion, including a second inserting connector, including a plurality of contacts for creating a second removable bus connection; a third printed circuit board portion, connected between the first printed circuit board portion and to the second printed circuit board portion, wherein a rigidity of the third printed circuit board portion is less than a rigidity of each of the first printed circuit board portion and the second printed circuit board portion; and proving a component, including: a first receiving connector, configured to receive the first inserting connector to create the first removable bus connection; and a second receiving connector, configured to receive the second inserting connector to create the second removable bus connection; wherein the multilayer printed circuit board is foldable along the third printed circuit board portion and, if so folded, the first printed circuit board portion is arranged on top of the second printed circuit board portion.

In Example 28, the method of Example 27 is disclosed, wherein the first printed circuit board portion is galvanically connected to the second printed circuit board portion via the third printed circuit board portion.

In Example 29, the method of any one of Examples 27 or 28 is disclosed, wherein the first printed circuit board portion is galvanically connected to a first side of the third printed circuit board portion, and the second printed circuit board portion is galvanically connected to a second side of the third printed circuit board portion.

In Example 30, the method of Example 29 is disclosed, wherein the first side of the third printed circuit board portion is opposite the second side of the third printed circuit board portion.

In Example 31, a method of manufacturing a printed circuit board package is disclosed, including providing a first printed circuit board, having a first length, including
an upper surface; a lower surface; and a first inserting connector, including a plurality of contacts for creating a first removable bus connection; providing a second printed circuit board, having a second length, less than the first length, and including an upper surface, fixedly mounted to the lower surface of the first printed circuit board; a lower surface; and a second inserting connector, including a plurality of contacts for creating a second removable bus connection.

In Example 32, the method of Example 31 is disclosed, wherein the first printed circuit board further includes a cutout.

In Example 33, the method of Example 31 or 32 is disclosed, wherein the first printed circuit board includes a first side and a second side, opposite the first side, and wherein the first inserting connector is located along the second side; wherein the second printed circuit board includes a first side and a second side, opposite the first side, and wherein the second inserting connector is located along the second side; and wherein a distance between the first side of the first printed circuit board and the cutout is approximately equal to a distance between the first side of the second printed circuit board and the second inserting connector.

In Example 34, the method of Example 32 or 33 is disclosed, wherein the second inserting connector is visible through the cutout.

In Example 35, the method of any one of Examples 31 to 34 is disclosed, further including an electro-conductive layer between the first printed circuit board and the second printed circuit board.

In Example 36, the method of Example 35 is disclosed, wherein the electro-conductive layer is configured to rigidly fix the first printed circuit board to the second printed circuit board.

In Example 37, the method of Example 35 or 36 is disclosed, wherein the electro-conductive layer includes a sintering paste.

In Example 38, a method of manufacturing a bus connection system is disclosed, including providing a printed circuit board package, including a first printed circuit board, having a first length, including an upper surface; a lower surface; and a first inserting connector, including a plurality of contacts for creating a first removable bus connection; a second printed circuit board, having a second length less than the first length, including an upper surface, fixedly mounted to the lower surface of the first printed circuit board; a lower surface; and a second inserting connector, including a plurality of contacts for creating a second removable bus connection; and providing a component, including: a first receiving connector, configured to receive the first inserting connector to create the first removable bus connection; and a second receiving connector, configured to receive the second inserting connector to create the second removable bus connection.

In Example 39, the method of Example 38 is disclosed, wherein the first printed circuit board further includes a cutout.

In Example 40, the method of Example 38 or 39 is disclosed, wherein the first printed circuit board includes a first side and a second side, opposite the first side, and wherein the first inserting connector is located along the second side; wherein the second printed circuit board includes a first side and a second side, opposite the first side, and wherein the second inserting connector is located along the second side; and wherein a distance between the first side of the first printed circuit board and the cutout is approximately equal to a distance between the first side of the second printed circuit board and the second inserting connector.

In Example 41, the method of Example 39 or 40 is disclosed, wherein the second inserting connector is visible through the cutout.

In Example 42, the method of any one of Examples 38 to 41 is disclosed, further including an electro-conductive layer between the first printed circuit board and the second printed circuit board.

In Example 43, the method of Example 42 is disclosed, wherein the electro-conductive layer is configured to rigidly fix the first printed circuit board to the second printed circuit board.

In Example 44, the method of Example 42 or 43 is disclosed, wherein the electro-conductive layer includes a sintering paste.

It is appreciated that implementations of methods detailed herein are demonstrative in nature, and are thus understood as capable of being implemented in a corresponding device. Likewise, it is appreciated that implementations of devices detailed herein are understood as capable of being implemented as a corresponding method. It is thus understood that a device corresponding to a method detailed herein may include one or more components configured to perform each aspect of the related method.

All acronyms defined in the above description additionally hold in all claims included herein.

What is claimed is:

1. A multilayer printed circuit board, comprising: a first printed circuit board portion, comprising a first inserting connector, comprising a plurality of contacts for creating a first removable bus connection; a second printed circuit board portion, comprising a second inserting connector, comprising a plurality of contacts for creating a second removable bus connection; a third printed circuit board portion, connected between the first printed circuit board portion and to the second printed circuit board portion, wherein a rigidity of the third printed circuit board portion is less than a rigidity of each of the first printed circuit board portion and the second printed circuit board portion; wherein the multilayer printed circuit board is foldable along the third printed circuit board portion and, if so folded, the first printed circuit board portion is arranged on top of the second printed circuit board portion, wherein the first printed circuit board portion is galvanically connected to a first side of the third printed circuit board portion, and the second printed circuit board portion is galvanically connected to a second side of the third printed circuit board portion.

2. The multilayer printed circuit board of claim 1, wherein the first printed circuit board portion is galvanically connected to the second printed circuit board portion via the third printed circuit board portion.

3. The multilayer printed circuit board of claim 1, wherein the first side of the third printed circuit board portion is opposite the second side of the third printed circuit board portion.

4. A bus connection system, comprising:
a multilayer printed circuit board, comprising:
a first printed circuit board portion, comprising
a first inserting connector, comprising a plurality of contacts for creating a first removable bus connection;
a second printed circuit board portion, comprising
a second inserting connector, comprising a plurality of contacts for creating a second removable bus connection;
a third printed circuit board portion, connected between the first printed circuit board portion and to the second printed circuit board portion, wherein a rigidity of the third printed circuit board portion is less than a rigidity of each of the first printed circuit board portion and the second printed circuit board portion; and
a component, comprising:
a first receiving connector, configured to receive the first inserting connector to create the first removable bus connection; and
a second receiving connector, configured to receive the second inserting connector to create the second removable bus connection;
wherein the multilayer printed circuit board is foldable along the third printed circuit board portion and, if so folded, the first printed circuit board portion is arranged on top of the second printed circuit board portion.

5. The bus connection system of claim 4, wherein the first printed circuit board portion is galvanically connected to the second printed circuit board portion via the third printed circuit board portion.

6. The bus connection system of claim 4, wherein the first printed circuit board portion is galvanically connected to a first side of the third printed circuit board portion, and the second printed circuit board portion is galvanically connected to a second side of the third printed circuit board portion.

7. The bus connection system of claim 6, wherein the first side of the third printed circuit board portion is opposite the second side of the third printed circuit board portion.

8. A printed circuit board package, comprising: a first printed circuit board, having a first length, comprising an upper surface; a lower surface; and a first inserting connector, comprising a plurality of contacts for creating a first removable bus connection; a second printed circuit board, having a second length, less than the first length, and comprising: an upper surface, fixedly mounted to the lower surface of the first printed circuit board; a lower surface; and a second inserting connector, comprising a plurality of contacts for creating a second removable bus connection, wherein the first printed circuit board comprises a first side and a second side, opposite the first side, and wherein the first inserting connector is located along the second side; wherein the second printed circuit board comprises a first side and a second side, opposite the first side, and wherein the second inserting connector is located along the second side.

9. The printed circuit board package of claim 8, wherein the first printed circuit board further comprises a cutout.

10. The printed circuit board package of claim 9, wherein the second inserting connector is visible through the cutout.

11. The printed circuit board package of claim 8, wherein the first printed circuit board comprises a first side and a second side, opposite the first side, and wherein the first inserting connector is located along the second side; wherein the second printed circuit board comprises a first side and a second side, opposite the first side, and wherein the second inserting connector is located along the second side; and wherein a distance between the first side of the first printed circuit board and the cutout is approximately equal to a distance between the first side of the second printed circuit board and the second inserting connector.

12. The circuit board package of claim 8, further comprising an electro-conductive layer between the first printed circuit board and the second printed circuit board.

13. The circuit board package of claim 12, wherein the electro-conductive layer is configured to rigidly fix the first printed circuit board to the second printed circuit board.

14. The circuit board package of claim 12, wherein the electro-conductive layer comprises a sintering paste.

15. A bus connection system, comprising:
a printed circuit board package, comprising:
 a first printed circuit board, having a first length, comprising
 an upper surface;
 a lower surface; and
 a first inserting connector, comprising a plurality of contacts for creating a first removable bus connection;
 a second printed circuit board, having a second length less than the first length, comprising
 an upper surface, fixedly mounted to the lower surface of the first printed circuit board;
 a lower surface; and
 a second inserting connector, comprising a plurality of contacts for creating a second removable bus connection; and
a component, comprising:
 a first receiving connector, configured to receive the first inserting connector to create the first removable bus connection; and
 a second receiving connector, configured to receive the second inserting connector to create the second removable bus connection.

16. The bus connection system of claim 15, wherein the first printed circuit board further comprises a cutout.

17. The bus connection system of claim 15, wherein the first printed circuit board comprises a first side and a second side, opposite the first side, and wherein the first inserting connector is located along the second side; wherein the second printed circuit board comprises a first side and a second side, opposite the first side, and wherein the second inserting connector is located along the second side; and wherein a distance between the first side of the first printed circuit board and the cutout is approximately equal to a distance between the first side of the second printed circuit board and the second inserting connector.

18. The bus connection system of claim 15, further comprising an electro-conductive layer between the first printed circuit board and the second printed circuit board, wherein the electro-conductive layer is configured to rigidly fix the first printed circuit board to the second printed circuit board.

19. The bus connection system of claim 18, wherein the electro-conductive layer comprises a sintering paste.

\* \* \* \* \*